(12) United States Patent
Yang et al.

(10) Patent No.: US 12,283,942 B2
(45) Date of Patent: Apr. 22, 2025

(54) PIEZOELECTRIC RESONATOR

(71) Applicant: AAC Technologies (Nanjing) Co., Ltd., Nanjing (CN)

(72) Inventors: Shuai Yang, Shenzhen (CN); Ke Wu, Shenzhen (CN); Lirong Zhang, Shenzhen (CN); Zhiqiang Zhuang, Shenzhen (CN); Chao Wang, Shenzhen (CN)

(73) Assignee: AAC Technologies (Nanjing) Co., Ltd., Nanjing (CN)

( * ) Notice: Subject to any disclaimer, the term of this patent is extended or adjusted under 35 U.S.C. 154(b) by 785 days.

(21) Appl. No.: 17/563,073

(22) Filed: Dec. 28, 2021

(65) Prior Publication Data
US 2023/0163750 A1    May 25, 2023

(30) Foreign Application Priority Data
Nov. 25, 2021    (CN) .................. 202122921061.X (51) Int. Cl.
*H03H 9/17*    (2006.01)
*H03H 9/02*    (2006.01)

(52) U.S. Cl.
CPC ........ *H03H 9/175* (2013.01); *H03H 9/02015* (2013.01)

(58) Field of Classification Search
CPC .................. H03H 9/175; H03H 9/02015
See application file for complete search history.

(56) References Cited

U.S. PATENT DOCUMENTS

| | | | |
|---|---|---|---|
| 2016/0118957 A1* | 4/2016 | Burak | H03H 9/02102 333/187 |
| 2017/0230031 A1* | 8/2017 | Yokoyama | H03H 9/52 |
| 2021/0028765 A1* | 1/2021 | Wang | H03H 9/564 |
| 2021/0399124 A1* | 12/2021 | Liao | H01L 29/404 |

\* cited by examiner

*Primary Examiner* — Bryan P Gordon
(74) *Attorney, Agent, or Firm* — Wiersch Law Group (57) ABSTRACT

The present disclosure provides a piezoelectric resonator comprising a substrate having an acoustic reflection mirror, a bottom electrode stacked on the substrate, a piezoelectric layer disposed on the substrate and covering the bottom electrode, and a top electrode stacked on a surface of piezoelectric layer distal to the bottom electrode. An overlapping portion of the acoustic reflection mirror, the bottom electrode, the piezoelectric layer, and the top electrode along a thickness direction of the piezoelectric resonator is a resonance region. A sidewall of the top electrode or a bottom electrode recesses to form a recessing portion. The recessing portion does not extend to an upper surface or a lower surface of the top electrode or the bottom electrode.

10 Claims, 6 Drawing Sheets

PIEZOELECTRIC RESONATOR

FIELD OF THE PRESENT DISCLOSURE

The present disclosure relates to a field of piezoelectric technology, and more particularly, to a piezoelectric resonator.

DESCRIPTION OF RELATED ART

With the increasing number of smart devices and the continuous popularization of the Internet of Things and 5G technologies, there is an increasing demand for high-performance filters and multifunctional devices. As an important part of the filter and multifunctional device, the acoustic resonator has become the focus of research member in recent years. The main acoustic resonators include surface acoustic wave resonators (Surface Acoustic Wave, SAW) and bulk acoustic wave resonators (Bulk Acoustic Wave, BAW). Due to its simple manufacturing process and low cost, SAW resonators occupy the mainstream market of middle and low frequency (below 2 GHz). However, SAW resonators have the disadvantages of low quality factor (Q factor), large temperature coefficient of frequency (TCF), and poor compatibility with semiconductor processes, which resulting in poor rectangular coefficients, high insertion loss, and large temperature drift of filters which is composed of SAW resonators.

In addition, with the increase of the working frequency, a width of the interdigital electrodes of the SAW resonator and a space between adjacent interdigital electrodes decrease, which not only increases the complexity and cost of the manufacturing process, but also results the deterioration of the reliability of the device. These disadvantages are hindering the application of SAW resonators to higher frequency bands.

The appearance of BAW resonators not only can make up for the deficiencies of SAW resonators, but also is compatible with mature semiconductor manufacturing processes. But due to the complicated process and high manufacturing difficulty of the BAW resonator, the cost remains high, and making it difficult to completely replace the SAW resonator in the middle and high frequency bands, and it is even uncompetitive in the low frequency band. In addition to the development in the communication field, BAW resonators are also widely used in piezoelectric microphones, pressure sensors or other sensor fields due to their excellent performance.

BAW resonators are different from SAW resonators in that the longitudinal waves are used to generate resonance in the piezoelectric film, and the spreading direction of the longitudinal waves is the thickness direction of the piezoelectric material. By adjusting the type and the thickness of the electrode material, the resonant frequency of the resonator can be easily adjusted. In order to generate resonance, in addition to piezoelectric materials and electrode layers arranged opposite to each other on the piezoelectric material to generate electrical excitation, there are usually acoustic reflection mirrors that cause wave can be reflected at the interface.

When the BAW resonator is working, high-frequency voltage is applied to the top electrode and the bottom electrode respectively. Under the action of the alternating electric field, the piezoelectric material is deformed, and the suspended film on the cavity or the acoustic reflection mirror oscillates, generating longitudinal waves parallel to the thickness direction and transverse clutter waves spreading in the direction perpendicular to the thickness (lateral). Under a specific frequency alternating voltage, the suspended film will resonate, and the device exhibits special electrical characteristics, so as to realize the transmission of specific frequency signals.

In the related art, in principle, although the main mode of resonance is the longitudinal wave mode, however, there are still some parasitic modes formed along with the longitudinal wave. Part of the transverse clutter wave will be reflected when it spreads to the edge of the resonance region, and superimposing with the incident wave to form a standing wave, and forming a clutter on the electrical characteristic curve of the device, which increasing the in-band wave and insertion loss of the filter. When these transverse clutters spread out from the edge of the resonance region, they will take away the energy in the resonance region, which resulting the energy leakage of the resonator, increasing the insertion loss of the filter, and reducing the quality factor (Q factor) of the device.

Starting from a typical resonator structure, the disadvantages of the related art are that, due to the boundary electrical conditions, the inclination of the C axis of the grown piezoelectric layer material in the thickness direction, and other factors, the acoustic wave mode excited by the resonator not only has the desired thickness direction mode (TE mode), but also includes transverse parasitic modes, such as Rayleigh-Lamb wave (RL mode), etc. When these transverse parasitic modes escape from the edge to the outside of the resonance region, the energy in the resonance region will be taken away, resulting in a decrease in the Q factor of the resonator.

As an improvement, the inventor thought of setting a pressure ring on the top electrode, the Q factor of the resonator and the width of the pressure ring are periodic. When the width of the pressure ring is larger, the Q factor of the resonator will be further increased, but an obvious parasitic resonance peak will be formed between the pressure ring and the bottom electrode. Due to the mass loading effect of the pressure ring, the frequency of the parasitic resonance peak will be lower than the main resonance frequency, which will affect the insertion loss of the low-frequency filter.

Therefore, it is desired to provide a new piezoelectric resonator which can overcome the aforesaid problems.

SUMMARY

In view of the above, the embodiments of the present disclosure provide a new piezoelectric resonator. By the present disclosure, the piezoelectric resonator has a high Q factor.

The present disclosure provides piezoelectric resonator comprising a substrate having an acoustic reflection mirror, a bottom electrode stacked on the substrate, a piezoelectric layer disposed on the substrate and covering the bottom electrode, and a top electrode stacked on a surface of piezoelectric layer distal to the bottom electrode. An overlapping portion of the acoustic reflection mirror, the bottom electrode, the piezoelectric layer, and the top electrode along a thickness direction of the piezoelectric resonator is a resonance region. A sidewall of the top electrode recesses toward a center of the top electrode to form a recessing portion, the recessing portion does not extend to an upper surface or a lower surface of the top electrode; or a sidewall of the bottom electrode recesses toward a center of the bottom electrode to form a recessing portion, the recessing portion does not extend to an upper surface or a lower surface of the bottom electrode.

As an improvement, the recessing portion is a continuous annular structure formed on the top electrode or the bottom electrode.

As an improvement, the recessing portion comprises at least two recessing structures spaced apart from each other formed on the top electrode or the bottom electrode.

As an improvement, a depth of the recessing portion extending inwardly from the sidewall of the top electrode or the bottom electrode is 1 nm to 20000 nm.

As an improvement, the recessing portion is at least partially filled with silicon oxide material.

As an improvement, a cross section of the recessing portion along the thickness direction of the piezoelectric resonator is a step shape, and a height of a portion of the recessing portion proximal to the center of the top electrode or the bottom electrode is not equal to the height of the portion of the recessing portion distal to the center of the top electrode or the bottom electrode.

As an improvement, the acoustic reflection mirror is a cavity formed above the substrate or a cavity inside the substrate, and the bottom electrode covers the cavity.

As an improvement, a projection of the top electrode along the thickness direction of the piezoelectric resonator locates in the acoustic reflection mirror.

As an improvement, a projection of the bottom electrode along the thickness direction of the piezoelectric resonator at least partially locates out of the acoustic reflection mirror.

As an improvement, the acoustic reflection mirror is a layer structure formed on a surface of the substrate, the layer structure is alternate stacked by at least one high acoustic impedance layer and at least one low acoustic impedance layer, the low acoustic impedance layer is silicon oxide, and the high acoustic impedance layer is at least one of W, Mo, Ru, Ir.

BRIEF DESCRIPTION OF THE DRAWINGS

Many aspects of the exemplary embodiments can be better understood with reference to the following drawing. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
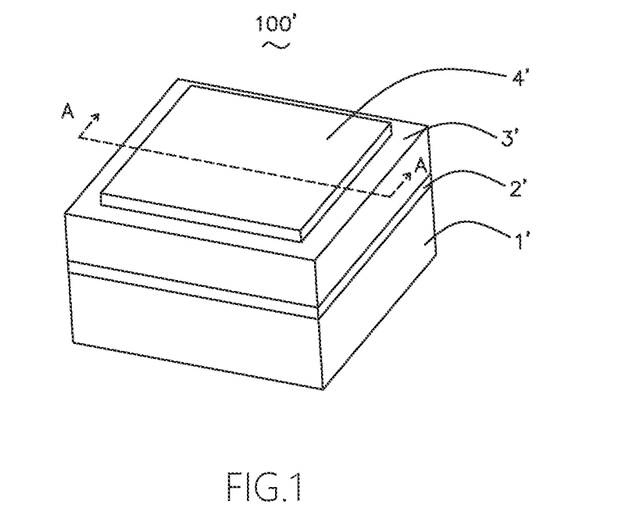
FIG. 1 is an illustrative isometric view of a piezoelectric resonator in related art.
Figure 2:
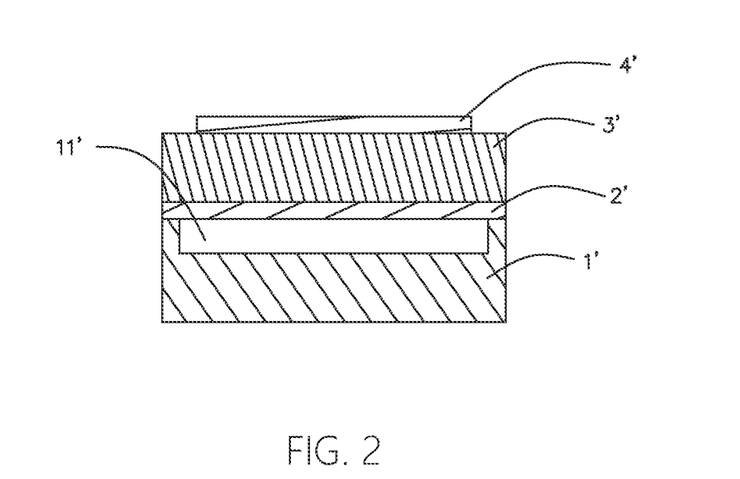
FIG. 2 is an illustrative cross-sectional view of the piezoelectric resonator taken along line A-A of FIG. 1.

Referring to the FIGS. 1 and 2, the related art provides a piezoelectric resonator 100' comprising a substrate 1', a bottom electrode 2', a piezoelectric layer 3', and a top electrode 4' stacked in sequence. A portion of a surface of the substrate 1' recesses to form a cavity. The cavity is seen as an acoustic reflection mirror 11'. The bottom electrode 2' is provided on the substrate 1' and covering the acoustic reflection mirror 11'. The piezoelectric layer 3' is fixed on the substrate 1' and covering the bottom electrode 2'. The top electrode 4' is provided on a side of the piezoelectric layer 3' distal to the bottom electrode 2'.

The main structure of the above ordinary piezoelectric resonator is composed of the bottom electrode, the piezoelectric layer and the top electrode, and the working principle is as follows: when radio frequency electrical signals are applied to the top and bottom electrodes, under the action of the inverse piezoelectric effect, the piezoelectric layer generates mechanical vibration in a longitudinal direction and forms a bulk acoustic wave. Because the surfaces of the top and bottom electrodes have total reflection boundary conditions, the spreading bulk acoustic wave will be constrained in the transducer (resonator). The bulk acoustic wave with a specific frequency forms a spreading longitudinally standing wave. Under the action of the piezoelectric effect, these bulk acoustic waves are converted into electrical signals. And a strength of the electrical signal converted by the bulk acoustic wave at the resonant frequency (fs) is largest (the impedance is smallest), and the strength of the electrical signal converted by the bulk acoustic wave at the anti-resonance frequency (fp) is smallest (the impedance is largest), thus realizing the selection of electrical signals.

Due to the boundary electrical conditions, the inclination of the grown piezoelectric layer material in the thickness direction, and other factors, an acoustic wave mode excited by the resonator not only has the desired thickness direction mode (TE mode), but also includes transverse parasitic modes, such as Rayleigh-Lamb wave (RL mode, mainly refers to the four modes of S0, A0, S1 and A1), etc. When these transverse parasitic modes escape from an edge to the outside of a resonance region, the energy in the resonance region will be taken away, resulting in a decrease in the Q factor of the resonator.

Figure 3:
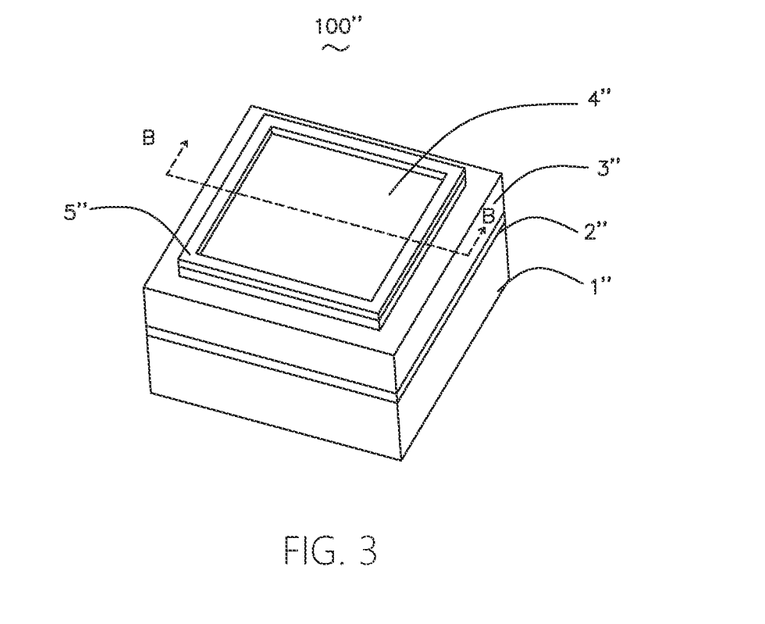
FIG. 3 is an illustrative isometric view of another piezoelectric resonator in related art.
Figure 4:
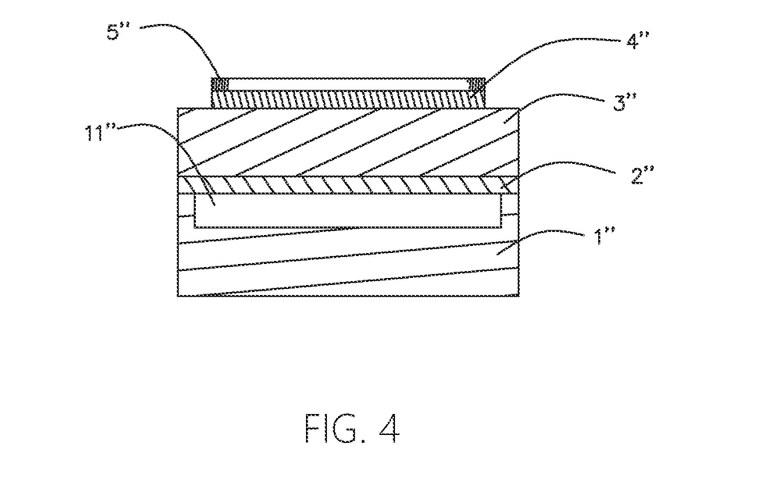
FIG. 4 is an illustrative cross-sectional view of the piezoelectric resonator taken along line B-B of FIG. 3.

As an improvement, referring to the FIGS. 3 and 4, inventor provides a piezoelectric resonator 100" comprising a substrate 1", a bottom electrode 2", a piezoelectric layer 3", and a top electrode 4" stacked in sequence. A portion of a surface of the substrate 1" recesses to form a cavity. The cavity is seen as an acoustic reflection mirror 11". The bottom electrode 2" is provided on the substrate 1" and covering the acoustic reflection mirror 11". The piezoelectric layer 3" is fixed on the substrate 1" and covering the bottom electrode 2". The top electrode 4" is provided on a side of the piezoelectric layer 3" distal to the bottom electrode 2". The above structure is same as the above-mentioned ordinary piezoelectric resonator 100'. The difference is that based on this structure, the improved resonator is provided with a pressure ring 5" on a surface of the top electrode 4" distal to the piezoelectric layer 3".

Compared with a central area of the top electrode 4", the top electrode 4" with the pressure ring 5" formed on the edge of an upper surface of the top electrode 4" has a higher acoustic impedance. The pressure ring 5" increases the degree of mismatch of the acoustic impedance between the central area of the top electrode 4" and the outside of the resonance region, so that the transverse acoustic waves spreading outside the resonance region are reflected back to the resonance region in the area of the pressure ring 5". The energy carried by these transverse acoustic waves is limited in the resonance region. Due to the reducing of the leakage energy, the Q factor of the resonator is improved.

However, the Q factor of the resonator and the width of the pressure ring 5" are periodic. When the width of the pressure ring 5" is larger, the Q factor of the piezoelectric resonator 100" will be further increased, but an obvious parasitic resonance peak will be formed between the pressure ring 5" and the bottom electrode 2", shown as FIG. 10. Due to the mass loading effect of the pressure ring 5", the frequency of the parasitic resonance peak will be lower than the main resonance frequency, which will affect the insertion loss of the low-frequency filter.

Figure 5:
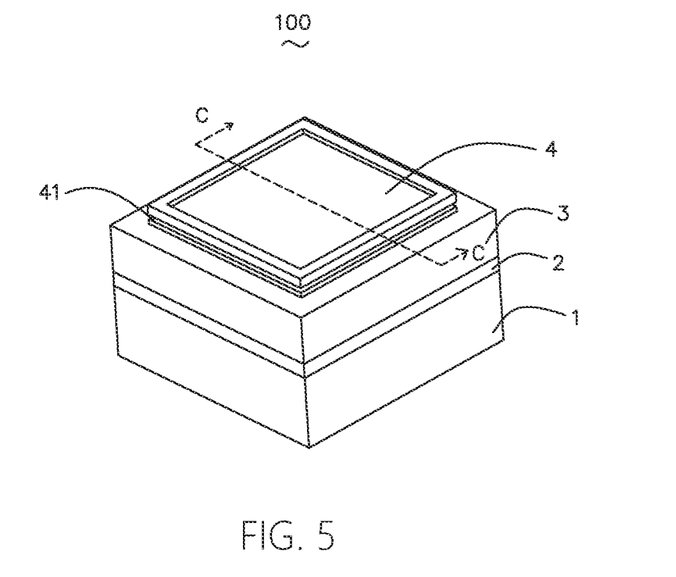
FIG. 5 is an illustrative isometric view of a piezoelectric resonator in present invention.
Figure 7:
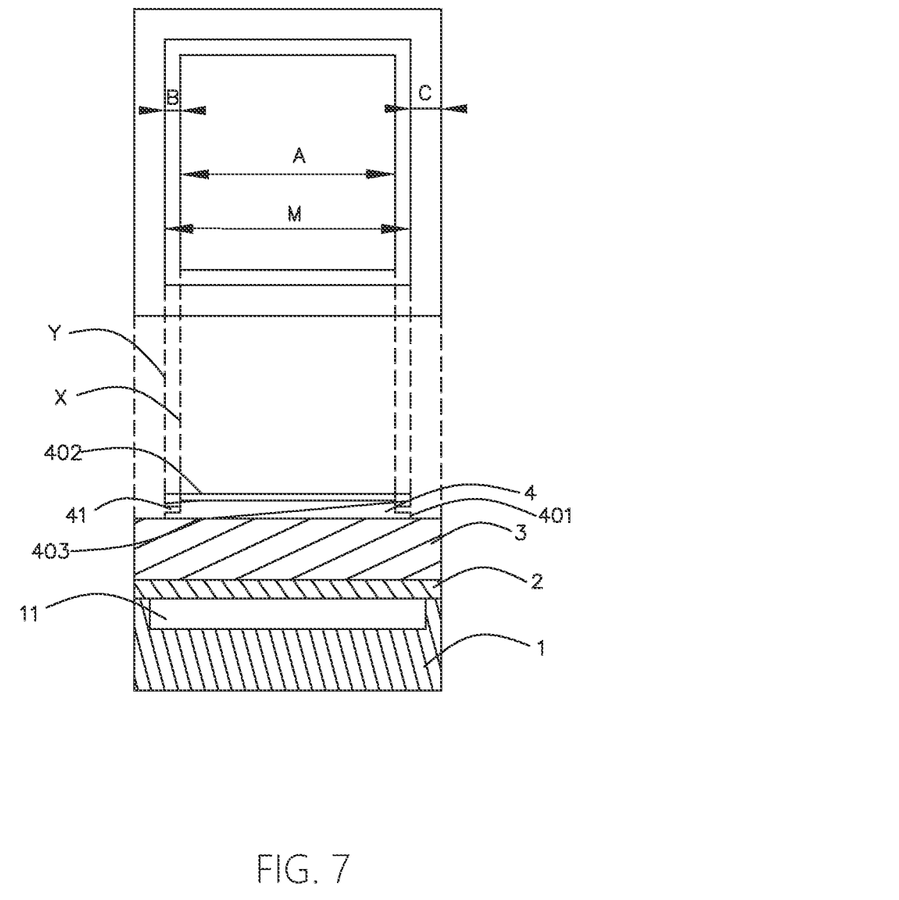
FIG. 7 is an illustrative front view and cross-sectional view of the piezoelectric resonator taken along line C-C of FIG. 5.

As another improvement, referring to the FIGS. 5 and 7, the present disclosure provides a new piezoelectric resonator 100 comprising a substrate 1 having an acoustic reflection mirror 11, a bottom electrode 2 stacked on the substrate 1, a piezoelectric layer 3 disposed on the substrate 1 and covering the bottom electrode 2, and a top electrode 4 stacked on the a surface of piezoelectric layer 3 distal to the bottom electrode 2. An overlapping portion of the acoustic reflection mirror 11, the bottom electrode 2, the piezoelectric layer 3, and the top electrode 4 along a thickness direction of the piezoelectric resonator 100 is a resonance region M. A sidewall 401 of the top electrode 4 recesses toward a center of the top electrode 4 to form a recessing portion 41. The recessing portion does not extend to an upper surface 402 or a lower surface 403 of the top electrode 4.

Figure 6:
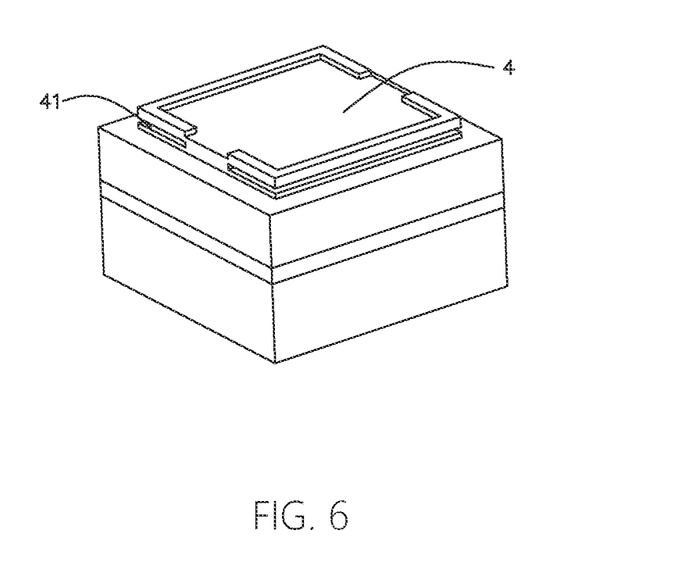
FIG. 6 is an illustrative isometric view of another piezoelectric resonator in present invention.

As shown in FIG. 5, the recessing portion 41 is a continuous annular structure formed on the top electrode 4. Or, As shown in FIG. 6, the recessing portion 41 comprises at least two recessing structures spaced apart from each other formed on the top electrode 4.

A depth of the recessing portion 41 extending inwardly from the sidewall 401 of the top electrode 4 is 1 nm to 20000 nm. The recessing portion 41 is at least partially filled with silicon oxide material. In present embodiment, an upper wall of the recessing portion 41 is parallel to the upper surface 402 of the top electrode 4. The recessing portion 41 is filled with air. While, when the piezoelectric resonator 100 is working in a vacuum, the recessing portion 41 is filled with vacuum. Or the recessing portion 41 also can be at least filled with a low acoustic impedance material, such as silicon oxide.

In above embodiment, due to an middle portion of the outer sidewall 401 recesses to form the recessing portion, as shown in FIG. 7, a transverse area where the top electrode 4 is located can be divided into the following three areas and two interfaces: a center area A without the recessing portion located on the top electrode, an area B with the recessing portion located on the top electrode, an area C out of the resonance region M, an interface X between area A and area B, and an interface Y between area B and area C. Because the acoustic impedance of areas A, B, and C is discontinuous, it will cause the transverse spreading Rayleigh-Lamb wave (RL mode) to be reflected at the interface X and interface Y, reducing the leakage of the energy carried by these transverse waves to the outside of the resonance region, and increasing the Q factor of the piezoelectric resonator 100. In addition, the recessing portion in the middle of the top electrode does not increase the mass of an edge of the top electrode, so the recessing portion will not form a parasitic resonance peak (a parasitic resonance peak like a pressure ring) in a range far below the main resonance frequency, and will not affect the insertion loss of the low-band filter, as shown in FIG. 10.

Figure 8:
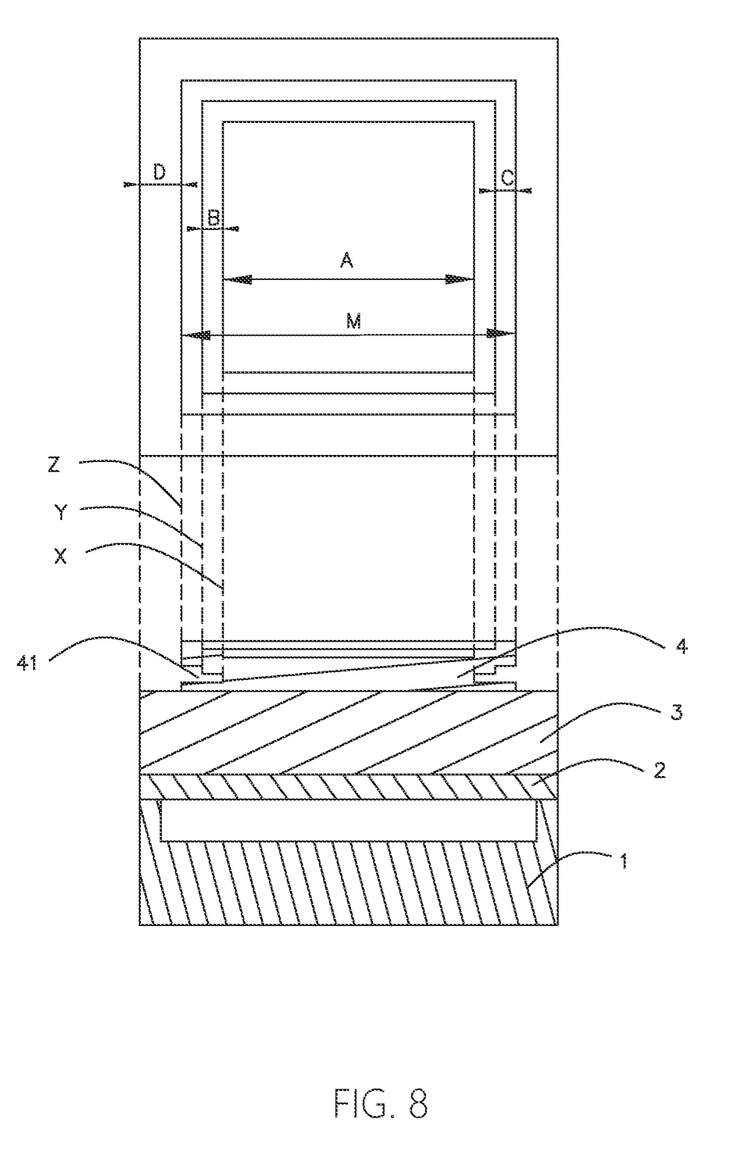
FIG. 8 is an illustrative front view and cross-sectional view of another piezoelectric resonator in present invention.

In another embodiment of the present disclosure, as shown in FIG. 8, a cross section of the recessing portion 41 along the thickness direction of the piezoelectric resonator 100 is a step shape, and a height of a portion of the recessing portion 41 proximal to the center of the top electrode 4 is not equal to the height of the portion of the recessing portion 41 distal to the center of the top electrode 4, optionally, the height of a portion of the recessing portion 41 proximal to the center of the top electrode 4 is less than the height of the portion of the recessing portion 41 distal to the center of the top electrode 4.

In above embodiment, due to the middle portion of the outer sidewall 401 recesses to form the recessing portion 41, a transverse area where the top electrode 4 is located can be divided into the following four areas and three interfaces: a center area A without the recessing portion located on the top electrode, an area B with the portion of the recessing portion proximal to the center of the top electrode, an area C with the portion of the recessing portion distal to the center of the top electrode, an area D out of the resonance region M, an interface X between area A and area B, an interface Y between area B and area C, and an interface Z between area C and area D. Because the acoustic impedance of areas A, B, C, and D is discontinuous, it will cause the transverse spreading Rayleigh-Lamb wave (RL mode) to be reflected at the interface X, interface Y, and interface Z, reducing the leakage of the energy carried by these transverse waves to the outside of the resonance region, and increasing the Q factor of the piezoelectric resonator 100. In addition, the recessing portion with stepped shape in the middle of the top electrode does not increase the mass of an edge of the top electrode, so the recessing portion will not form a parasitic resonance peak (a parasitic resonance peak like a pressure ring) in a range far below the main resonance frequency, and will not affect the insertion loss of the low-band filter.

Figure 10:
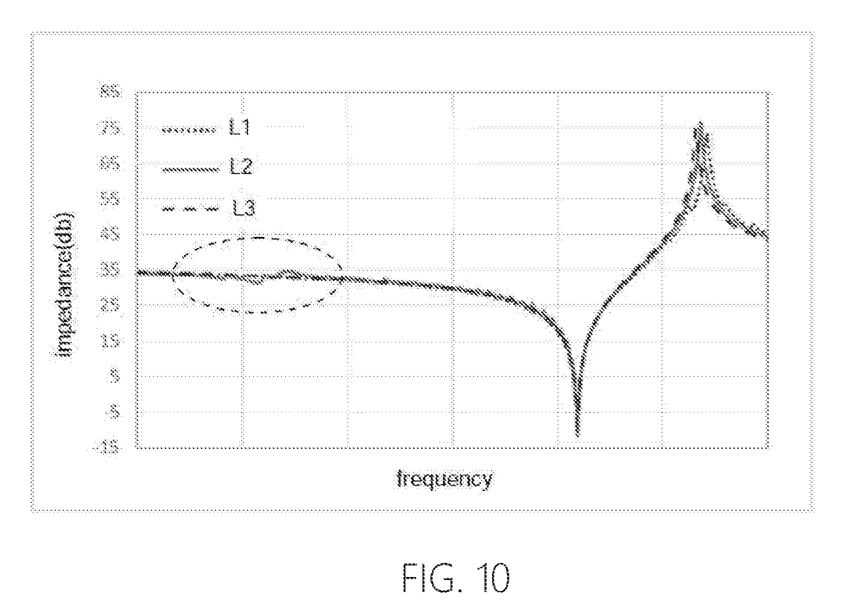
FIG. 10 is a comparison of simulated impedance curves of the ordinary piezoelectric resonator of FIG. 1, the piezoelectric resonator with a pressure ring on the top electrode of FIG. 3, and the piezoelectric resonator with a recessing portion on the top electrode of FIG. 5.

Referring to the FIG. 10, FIG. 10 is a comparison of simulated impedance curves of an ordinary piezoelectric resonator, a piezoelectric resonator with a pressure ring on the top electrode, and a piezoelectric resonator with a recessing portion on the top electrode. L1 is a impedance curve of an ordinary piezoelectric resonator 100', L2 is a impedance curve of the piezoelectric resonator 100" with the top electrode provided with a pressure ring 5", and L3 is a impedance curve of the piezoelectric resonator 100 with the top electrode provided with a recessing portion 41. It can be seen from FIG. 10, compared with the piezoelectric resonator 100" provided with a pressure ring 5", the piezoelectric resonator 100 using the recessing portion 41 has a smooth impedance curve in the low frequency range, that is, as shown by a dotted line in FIG. 10, in the condition of increasing the Q factor of the piezoelectric resonator, it avoids the problem of parasitic resonance peaks introduced when the width of the pressure ring is large.

In other embodiment, a sidewall of the bottom electrode also cam recess toward a center of the bottom electrode to form a recessing portion, and the recessing portion does not extend to an upper surface or a lower surface of the bottom electrode. The form of the recessing portion on the bottom electrode can be the same as the form of the recessing portion on the top electrode.

In present embodiments, as shown in FIGS. 7 and 8, the acoustic reflection mirror 11 is a cavity formed in the substrate 1. The bottom electrode 2 covers the cavity. A projection of the top electrode 4 along the thickness direction of the piezoelectric resonator 100 locates in the acoustic reflection mirror 11. A projection of the bottom electrode 2 along the thickness direction of the piezoelectric resonator 100 at least partially locates out of the acoustic reflection mirror 11. The acoustic reflection mirror 11 also can be a cavity formed above the substrate 1. For example, a layer of silicon nitride is arranged between the substrate 1 and the bottom electrode 2, and the silicon nitride has a cavity to form the acoustic reflection mirror 11.

Figure 9:
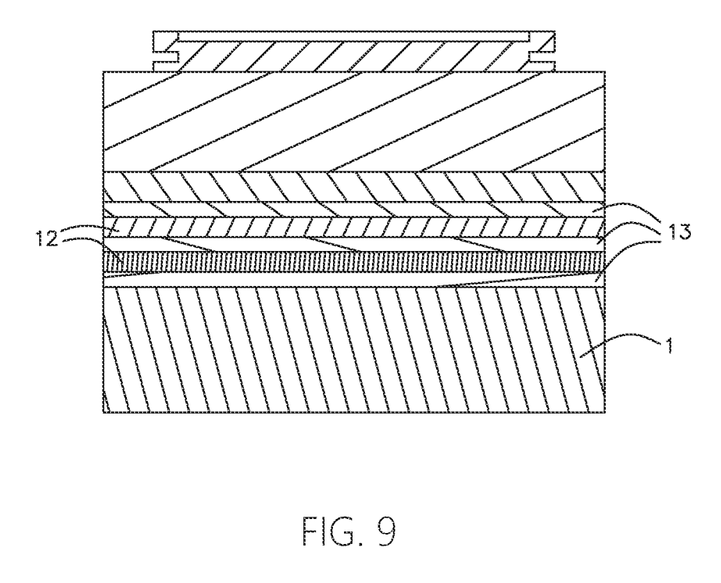
FIG. 9 is an illustrative cross-sectional view of another piezoelectric resonator in present invention.

And in other embodiments in present disclosure, the acoustic reflection mirror 11 also can be a layer structure formed on a surface of the substrate 1, as shown in FIG. 9, the substrate 1 is made of silicon material, the layer structure is alternate stacked by at least one high acoustic impedance layer 12 and at least one low acoustic impedance layer 13. The low acoustic impedance layer 13 is silicon oxide, and the high acoustic impedance layer 12 is at least one of W, Mo, Ru, Ir. Optionally, The acoustic reflection mirror 11 is formed by five layers, and the five layers are one low acoustic impedance layer 13, one high acoustic impedance layer 12, one low acoustic impedance layer 13, one high acoustic impedance layer 12, and one low acoustic impedance layer 13 that are alternate stacked on a substrate 1.

Comparing with the related art, the piezoelectric resonator of present disclosure comprises the recessing portion formed by recessed by the sidewall of the top electrode or the lower electrode, and the recessing portion is filled with air, or filled with vacuum in the vacuum state, or at least partially filled with low acoustic impedance material, so that the piezoelectric resonator 100 can effectively avoid the problem of parasitic resonance peaks in low frequency bands, and has a higher Q factor.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A piezoelectric resonator, comprising:
   a substrate having an acoustic reflection mirror;
   a bottom electrode stacked on the substrate;
   a piezoelectric layer disposed on the substrate and covering the bottom electrode; and
   a top electrode stacked on a surface of piezoelectric layer distal to the bottom electrode;
   wherein an overlapping portion of the acoustic reflection mirror, the bottom electrode, the piezoelectric layer, and the top electrode along a thickness direction of the piezoelectric resonator is a resonance region;
   a sidewall of the top electrode recesses toward a center of the top electrode to form a recessing portion, the recessing portion does not extend to an upper surface or a lower surface of the top electrode; or
   a sidewall of the bottom electrode recesses toward a center of the bottom electrode to form a recessing portion, the recessing portion does not extend to an upper surface or a lower surface of the bottom electrode.

2. The piezoelectric resonator as described in claim 1, wherein the recessing portion is a continuous annular structure formed on the top electrode or the bottom electrode.

3. The piezoelectric resonator as described in claim 1, wherein the recessing portion comprises at least two recessing structures spaced apart from each other formed on the top electrode or the bottom electrode.

4. The piezoelectric resonator as described in claim 1, wherein a depth of the recessing portion extending inwardly from the sidewall of the top electrode or the bottom electrode is 1 nm to 20000 nm.

5. The piezoelectric resonator as described in claim 1, wherein the recessing portion is at least partially filled with silicon oxide material.

6. The piezoelectric resonator as described in claim 1, wherein a cross section of the recessing portion along the thickness direction of the piezoelectric resonator is a step shape, and a height of a portion of the recessing portion proximal to the center of the top electrode or the bottom electrode is not equal to the height of the portion of the recessing portion distal to the center of the top electrode or the bottom electrode.

7. The piezoelectric resonator as described in claim 1, wherein the acoustic reflection mirror is a cavity formed above the substrate or a cavity inside the substrate, and the bottom electrode covers the cavity.

8. The piezoelectric resonator as described in claim 7, wherein a projection of the top electrode along the thickness direction of the piezoelectric resonator locates in the acoustic reflection mirror.

9. The piezoelectric resonator as described in claim 7, wherein a projection of the bottom electrode along the thickness direction of the piezoelectric resonator at least partially locates out of the acoustic reflection mirror.

10. The piezoelectric resonator as described in claim 1, wherein the acoustic reflection mirror is a layer structure formed on a surface of the substrate, the layer structure is alternate stacked by at least one high acoustic impedance layer and at least one low acoustic impedance layer, the low acoustic impedance layer is silicon oxide, and the high acoustic impedance layer is at least one of W, Mo, Ru, Ir.

* * * * *